US011506347B2

(12) United States Patent
Koivisto (10) Patent No.: US 11,506,347 B2
(45) Date of Patent: Nov. 22, 2022

(54) LED STRIP AND METHOD FOR MANUFACTURING A LED STRIP

(71) Applicant: Teknoware Oy, Lahti (FI)

(72) Inventor: Tuomas Koivisto, Lahti (FI)

(73) Assignee: TEKNOWARE OY, Lahti (FI)

( * ) Notice: Subject to any disclaimer, the term of this patent is extended or adjusted under 35 U.S.C. 154(b) by 0 days.

(21) Appl. No.: 17/523,344

(22) Filed: Nov. 10, 2021

(65) Prior Publication Data

US 2022/0146061 A1 May 12, 2022

(30) Foreign Application Priority Data

Nov. 12, 2020 (FI) ...................................... 20206146

(51) Int. Cl.
| F21S 4/24 | (2016.01) |
| F21V 29/83 | (2015.01) |
| F21V 19/00 | (2006.01) |
| H01L 33/64 | (2010.01) |
| F21Y 103/10 | (2016.01) |
| F21Y 115/10 | (2016.01) |

(52) U.S. Cl.
CPC .............. F21S 4/24 (2016.01); F21V 19/002 (2013.01); F21V 29/83 (2015.01); H01L 33/642 (2013.01); *F21Y 2103/10* (2016.08); *F21Y 2115/10* (2016.08)

(58) Field of Classification Search
CPC .......... F21S 4/24; F21V 29/83; F21V 19/002; H01L 33/642; F21Y 2103/10; F21Y 2115/10
See application file for complete search history.

(56) References Cited

U.S. PATENT DOCUMENTS

| 4,521,835 | A | * | 6/1985 | Meggs ...................... F21S 4/22 362/216 |
| 6,609,813 | B1 | | 8/2003 | Showers et al. |
| 10,125,934 | B1 | | 11/2018 | Zhang |
| 2003/0218879 | A1 | * | 11/2003 | Tieszen ..................... F21S 4/28 362/249.03 |
| 2010/0008085 | A1 | | 1/2010 | Ivey et al. |
| 2010/0171405 | A1 | | 7/2010 | Chan et al. |
| 2013/0107526 | A1 | | 5/2013 | Ishibashi |
| 2013/0135855 | A1 | | 5/2013 | Wildner |

(Continued)

FOREIGN PATENT DOCUMENTS

| CN | 207378568 U | | 5/2018 |
| CN | 209801214 U | * | 12/2019 |

(Continued)

*Primary Examiner* — Mary Ellen Bowman
(74) *Attorney, Agent, or Firm* — Brooks Kushman P.C.

(57) ABSTRACT

A LED strip having LED chips and a strip to which the LED chips are fixed and which also functions as a support structure of conductors coupled with the LED chips, and a tube manufactured from an elastic and at least partly light-transmitting material and surrounding the strip with the LED chips. At the outer surface of the tube there is a fixing element which is in essential parts of the same material as the tube. The LED strip includes a thermal conduction part which is of a material different from the tube and which, in the cross-section of the LED strip, is directed outwards from the inner surface of the tube for conducting waste heat generated in the LED chips out from the tube.

14 Claims, 7 Drawing Sheets

(56) References Cited

U.S. PATENT DOCUMENTS

| | | |
|---|---|---|
| 2017/0254518 A1 | 9/2017 | Vasylyev |
| 2019/0242538 A1 | 8/2019 | Zeng et al. |
| 2019/0309932 A1 | 10/2019 | Evans et al. |
| 2020/0256547 A1* | 8/2020 | Brown ...................... F21S 4/26 |

FOREIGN PATENT DOCUMENTS

| | | |
|---|---|---|
| CN | 209801214 U | 12/2019 |
| EP | 2541124 A2 | 1/2013 |
| EP | 2447031 B1 | 9/2014 |
| EP | 3348897 A1 | 7/2018 |
| JP | 2018018716 A | 2/2018 |
| WO | 2017098383 A1 | 6/2017 |

\* cited by examiner

LED STRIP AND METHOD FOR MANUFACTURING A LED STRIP

CROSS-REFERENCE TO RELATED APPLICATION

This application claims foreign priority benefits under 35 U.S.C. § 119(a)-(d) to FI patent application 20206146 filed Nov. 12, 2020, the disclosure of which is hereby incorporated by reference in its entirety.

FIELD OF THE INVENTION

The invention generally relates to structural parts of elongated LED luminaires. Specifically, the invention relates to a strip-type structure comprising LED light sources and means for fixing them to a structure functioning as a luminaire body or the like. In addition, the invention relates to a method for manufacturing such strip-type structure.

BACKGROUND OF THE INVENTION

Light emitting diodes (LEDs) have become so general that one can speak of simply LEDs and LED luminaires. Many luminaire and light source solutions make use of a LED strip in which light-producing LED chips are fixed to a strip-like base which at the same time functions as a support structure of conductors supplying electric current for the LED chips. At the back surface of the strip there may be a glue film by which the LED strip may be fixed to a desired surface. If the LED strip is required to be moisture-resistant and/or withstand other more demanding environmental conditions, its front side may be coated in connection with manufacture with a transparent, waterproof material such as silicone rubber. Alternatively or additionally, a separate transparent or translucent protective cover may be fixed over the LED strip after installation, which protective cover may, in addition to protecting against conditions, smooth the distribution of light produced by the LED chips.

It is not easy to build from the known LED strip solutions a luminaire which would combine firmness of structure, finished appearance, freedom of design (especially in terms of bent shapes) and affordable manufacturing costs. Further, with the known LED strip solutions it may be difficult to cause waste heat to be sufficiently effectively conducted away from the LED chips.

SUMMARY OF THE INVENTION

It is an object of the present invention to disclose a LED strip and a method of manufacture thereof, which provide a firm structure and finished appearance while keeping manufacturing costs at a reasonable level. In addition, it is an object of the invention that the LED strip solution allows plenty of freedom for the designer of the luminaire or other light source. It is a further object of the invention that the waste heat produced by the LED chips can be conducted out of the structure in a controlled manner.

The objects of the invention are achieved by using a profile made of an elastic material, inside which the LED strip is placed. The objects of the invention relating to thermal management are achieved by using, as a part of the profile, a thermal conductor forming a thermally conductive coupling from the LED chips or their immediate vicinity to the outside of the profile. In the cross-section of the profile there may be pre-provided means for connecting the profile to the place of installation with a form-fitting joint.

According to a first aspect a LED strip is described herein, which LED strip comprises LED chips and a strip to which the LED chips are fixed and which also functions as a support structure of conductors coupled with the LED chips. The LED strip further comprises a tube manufactured from an elastic and at least partly light-transmitting material and surrounding the strip with the LED chips. At the outer surface of the tube there is a fixing element which is in essential parts of the same material as the tube. For conducting waste heat generated in the LED chips out from the tube, the LED strip comprises a thermal conduction part which is of a material different from the tube and which, in the cross-section of the LED strip, is directed outwards from the inner surface of the tube.

According to one embodiment the thermal conduction part continues in a longitudinal direction of the tube substantially as far as there are LED chips in the strip surrounded by the tube. This provides at least the advantage that waste heat is efficiently conducted out from the tube throughout the whole length over which it is generated.

According to one embodiment there are several thermal conduction parts and a line formed by them continues in a longitudinal direction of the tube substantially as far as there are LED chips in the strip surrounded by the tube. This provides at least the advantage that in addition to efficient conduction of waste heat, it is possible to bend the tube for installation in many different ways.

According to one embodiment the thermal conduction part comprises an inner flange which is on the inner surface of the tube against said strip, one or more outer flanges which is or which are on the outer surface of the tube or the fixing element or on the surface of a cavity in the fixing element, and a portion connecting the inner flange with the outer flange or flanges. This provides at least the advantage that heat is conducted to the thermal conduction part from a wide area and it is also transferred away from the thermal conduction part outside the tube from a wide area.

According to one embodiment the thermal conduction part is gapped in the longitudinal direction of the tube with repeated gaps to improve flexibility of the thermal conduction part. This provides at least the advantage that the thermal conduction part allows the LED strip to be bent in many different ways.

According to one embodiment the fixing element comprises a locking part and a neck part, of which the neck part is narrower than the locking part in a transverse direction of the tube and is located between the tube and the locking part. The fixing element may continue in the longitudinal direction of the tube such that the tube and the fixing element form a uniform profile. This provides at least the advantage that the LED strip is, throughout its length, easily and firmly fixable to a body of a luminaire or other larger unit comprising an elongated slot.

According to one embodiment the cross-section of the locking part of the fixing element branches into at least two branches such that it allows placement of a separate securing element between these branches. This provides at least the advantage that the LED strip fixed in place does not very easily come off accidentally or due to an unauthorized removal attempt.

According to one embodiment the cross-section of the locking part comprises a widened socket between said branches for receiving the securing element. This provides at least the advantage that the securing element stays relatively safely in its place.

According to one embodiment, inside the tube on that side of the strip to which the LED chips are fixed there is a light-transmitting optical element continuing in the longitudinal direction of the tube over several LED chips. This provides at least the advantage that the properties of the light directed out from the tube may be influenced in a desired way.

According to one embodiment the inner surface of the tube comprises at least one slot for receiving an edge or edges of the strip. This provides at least the advantage that the strip is set in connection with manufacture precisely at a desired place in the tube and stays there.

According to a second aspect a luminaire is described herein, which luminaire comprises a body and a LED strip according to any of the preceding characterizations fixed thereto.

According to one embodiment the body comprises an elongated slot. The LED strip may then be one having a fixing element comprising a locking part and a neck part, of which the neck part is narrower than the locking part in a transverse direction of the tube and is located between the tube and the locking part. The fixing element may continue in the longitudinal direction of the tube such that the tube and the fixing element form a uniform profile. The locking part of the fixing element may project via the slot to a different side of the body than the tube. This provides at least the advantage that the LED strip can be firmly and neatly fixed along its whole length to the body of the luminaire.

According to a third aspect a method for manufacturing a LED strip is described herein. The method comprises manufacturing a tube from an elastic and at least partly light-transmitting material, and fixing LED chips to a strip on the surface of which conductors have been formed. The LED chips are coupled with said conductors, and the strip with the LED chips is placed inside the tube. The tube is provided with a thermal conduction part directed outwards from the inner surface of the tube for conducting waste heat generated in the LED chips out from the tube.

According to one embodiment a profiled thermally conductive strip continuing in a longitudinal direction of the tube substantially as far as there are LED chips in the strip surrounded by the tube is used as the thermal conduction part. This provides at least the advantage that waste heat is efficiently conducted out from the tube throughout the whole length over which it is generated.

According to one embodiment the thermal conduction part is gapped in the longitudinal direction of the tube with repeated gaps to improve flexibility of the thermal conduction part. This provides at least the advantage that the thermal conduction part allows bending of the LED strip in many different ways in subsequent stages of manufacture.

According to one embodiment the method comprises manufacturing, in connection with manufacturing the tube, from the same material a fixing element which projects from the outer surface of the tube and which is provided with a locking part and a neck part, of which the neck part is narrower than the locking part in a transverse direction of the tube and is located between the tube and the locking part. The fixing element may be manufactured in such a way that it continues in the longitudinal direction of the tube, forming a uniform profile with the tube. This provides at least the advantage that the LED strip is easily and firmly fixable to a desired structure along its whole length.

According to one embodiment, in addition to the LED chips and the strip supporting them, a light-transmitting optical element continuing in the longitudinal direction of the tube over several LED chips is placed inside the tube. This provides at least the advantage that the properties of the light directed out from the tube may be influenced in a desired way.

DETAILED DESCRIPTION OF THE INVENTION

Figure 1:
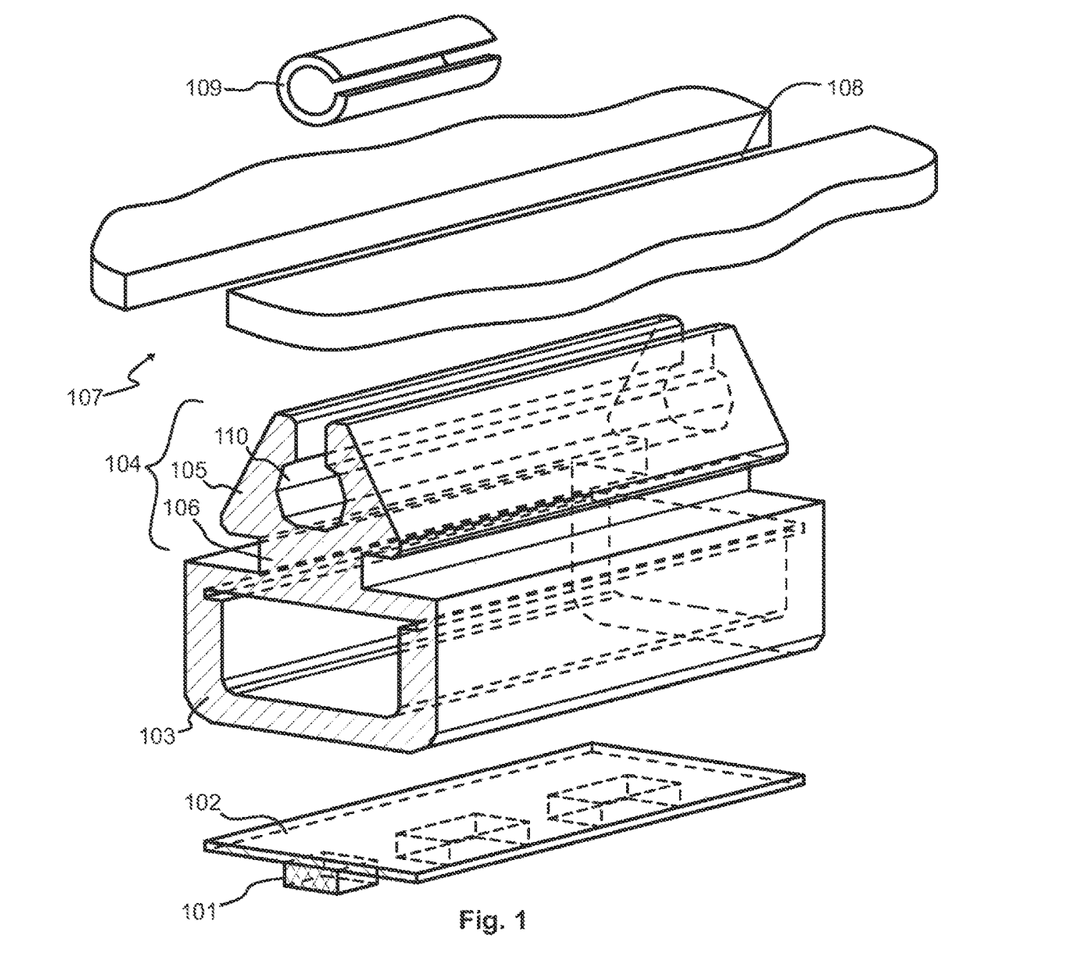
FIG. 1 illustrates parts of a LED strip and its fixing point separated from each other.

FIG. 1 illustrates parts of a LED strip as an exploded view. The figure illustrates one section of the parts of the LED strip cut in their longitudinal direction. The sections illustrated in the figure may be considered to continue in a longitudinal direction which extends, with respect to the position illustrated in the figure, from the front left to the back right.

The lowermost element in the figure may be called the functional core of the LED strip. It comprises LED chips 101 and a strip 102 to which the LED chips 101 are fixed. The strip 102 also functions as a support structure of conductors coupled with the LED chips 101. The conductors are not separately illustrated in FIG. 1. The LED chips 101 may be spaced in the strip 102 at regular or irregular distances from each other. The LED chips may be all identical to each other or there may be different kinds of LED chips. For example, several LEDs of different colours for producing light of a desired colour and/or white LEDs representing two or more different colour temperatures for producing a desired colour temperature may be fixed to the strip 102.

The part indicated by reference number 103 is a tube manufactured from an elastic material. In a finished product the strip 102 with the LED chips 101 fixed thereto is placed inside the tube 103. At least part of the tube 103 must transmit light. One possibility is to manufacture the tube 103 entirely from a light-transmitting material which may be for example some transparent or translucent, elastic polymer such as colourless silicone rubber. It is also possible that only some portion of the tube, for example its surface facing down in FIG. 1 or some part of it, is of a light-transmitting material.

A fixing element 104 projects from the outer surface of the tube 103, in the position illustrated in FIG. 1 from its upper surface. It is in essential parts of the same material as the tube 103. The fixing element 104 comprises a locking part 105 and a neck part 106. The neck part 106 is narrower than the locking part 105, when viewed in a transverse direction of the tube 103. The neck part 106 is located between the tube 103 and the locking part 105.

The fixing element 104 continues in a longitudinal direction of the tube 103 such that the tube 103 and the fixing element 104 form a uniform profile. This means that the unit formed by the tube 103 and the fixing element 104 has a cross-section which remains substantially the same at least for a significant distance in the longitudinal direction of the tube 103. This provides a manufacturing advantage, because this type of profile may be relatively simply manufactured by the meter even in large quantities, if necessary. If the fixing element is not an important feature in some application, the fixing of the tube 103 to form part of a luminaire or other larger unit may also be performed in other ways, for example with glue or supporting clips. Then the fixing element at the outer surface of the tube 103 may be as simple as some sufficiently flat portion of the outer surface of the tube 103 to enable gluing or other sufficiently close placement against the mounting surface. Conical or pin-type fixing elements may also be used, which can be considered as short sections of the fixing element 104 shown in FIG. 1 at a regular or irregular spacing as viewed in the longitudinal direction of the tube 103.

At the top, FIG. 1 illustrates a section of a body 107 comprising an elongated slot 108. The width of the slot 108 is of the same order as the width of the neck part 106 of the fixing element 104. The body 107 may be for example the body of a luminaire. The term "body" does not mean that this part should necessarily have any other essential structural purpose than to function as a place to which the LED strip is fixed. The purpose of a roll pin 109 illustrated topmost in the figure will be best understood by reference to FIG. 2.

Figure 2:
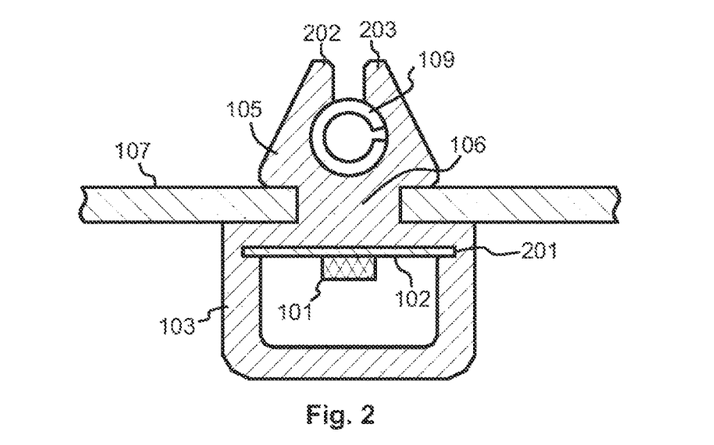
FIG. 2 illustrates a cross-section of the structure according to FIG. 1 in assembled form.

FIG. 2 is a cross-section of a LED strip obtained by assembling the parts illustrated in FIG. 1. In FIG. 2 it is shown how the tube 103 surrounds the strip 102 with the LED chips. The inner surface of the tube 103 comprises two slots 201 for receiving edges of the strip 102. There could also be only one slot or the inner surface of the tube 103 could be entirely without the slots, if maintenance of the strip 102 at a desired place inside the tube 103 can be ensured in other ways, for example by means of glue.

In FIG. 2 it is also shown how the locking part 105 of the fixing element projects via the slot of the body 107 to a different side of the body 107 than the tube 103. The neck part 106 of the fixing element is situated in the slot of the body 107. This illustrates one reason why the material from which the tube 103 and the fixing part 104 are manufactured must be elastic. At the same time, one can derive from this one definition for when the material is elastic enough as intended herein. Because the locking part 105 is wider in cross-section than the slot of the body 107, the material must allow, in terms of its elasticity, an elastic deformation acting on the locking part 105 due to which it is possible to push the locking part 105 through the slot to the other side of the body 107. The slot in the body 107 is of the same order in width as the width of the neck part 106 in the cross-section of the LED strip. Thus, one may as well determine that the material must allow, in terms of its elasticity, an elastic deformation acting on the locking part 105 due to which the width of the locking part 105 in the cross-section of the LED strip is momentarily caused to be equal to or smaller than the width of the neck part 106.

FIG. 2 also shows what is the purpose in that the cross-section of the locking part 105 branches into at least two branches 202 and 203. Not only may this type of branched shape facilitate the elastic deformation needed for the fixing stage, but it also allows a separate securing element (such as the roll pin 109) to be placed between these branches 202 and 203. In the finished assembly the roll pin 109 or other securing element reduces the possibility that the LED strip would accidentally come off the body 107 for example by the effect of some force pulling downward (with respect to the position illustrated in FIG. 2). The roll pin 109 or other securing element may be in the longitudinal direction equally long as the rest of the LED strip, but this is not necessary. Because the risk of accidental unfastening is generally highest at the ends of the LED strip, it is in many cases sufficient if there is one roll pin 109 or other securing element at each end of the LED strip. If the LED strip is very long, one or more additional securing elements may be used at specific intervals to ensure the fixation.

If a branched form of the fixing element 104 and a separate securing element are used, it is possible to influence the retainability of the securing element by suitable design of the branches 202 and 203 of the fixing element 104. In the embodiment illustrated in FIGS. 1 and 2, the cross-section of the locking part 105 comprises a widened socket 110 between the branches 202 and 203 for receiving the securing element. In this respect the elasticity of the material of the fixing element 104 is also helpful: when the roll pin 109 or other securing element has been placed in the socket 110, the branches 202 and 203 of the fixing element elastically return to their original position. Removal of the securing element would first require bending the branches 202 and 203 outwards. Just pulling the LED strip downwards rather bends the branches 202 and 203 inwards, preventing the securing element from coming off accidentally.

If conical or pin-type fixing elements are used instead of a fixing element continuing in the longitudinal direction of the tube, there may be corresponding holes instead of the slot 108 in the body 107. If, on the other hand, the fixing element is simply some flat portion of the outer surface of the tube, it is sufficient that the body comprises a corresponding abutment surface.

Figure 3:
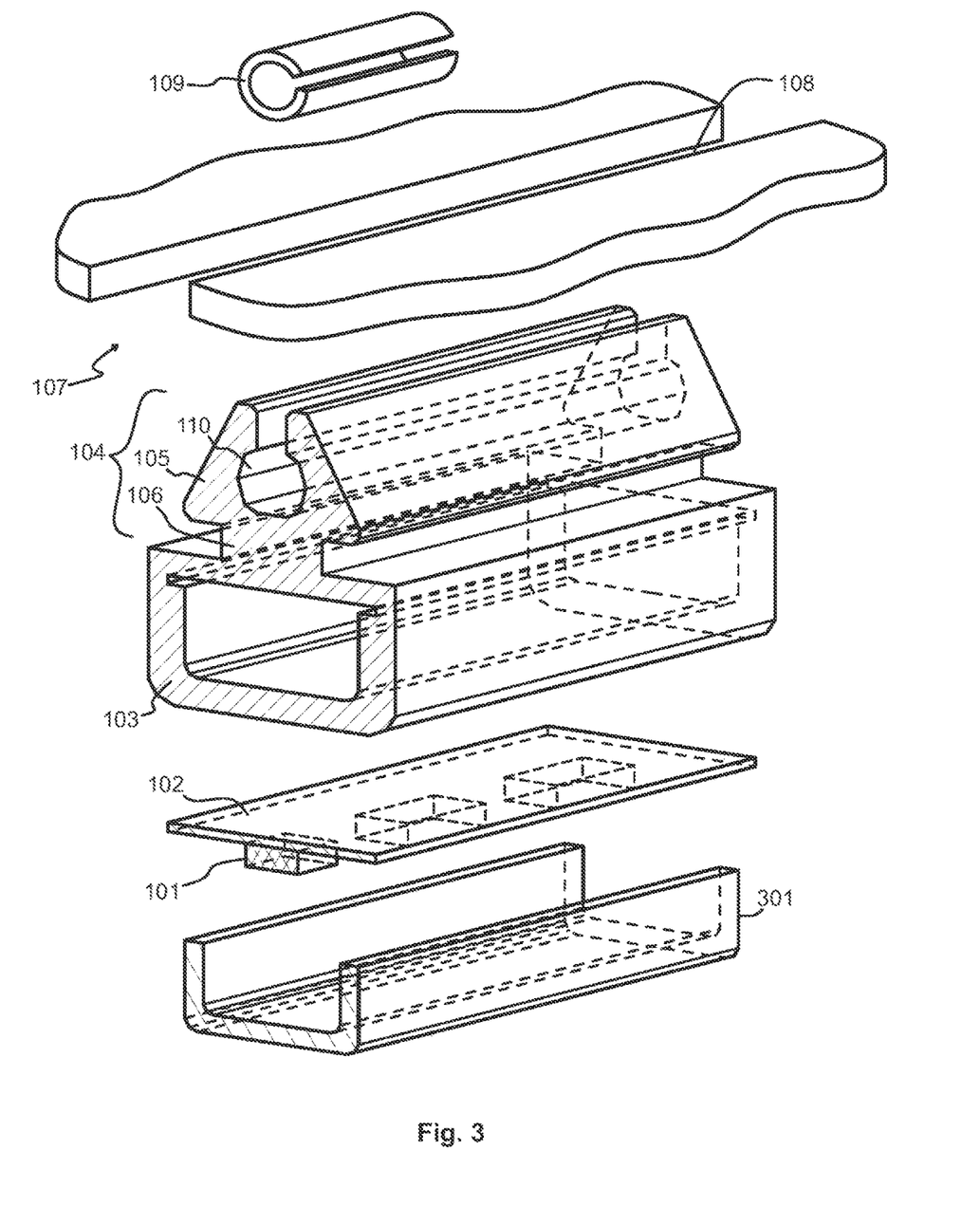
FIG. 3 illustrates parts of another LED strip and its fixing point separated from each other.
Figure 4:
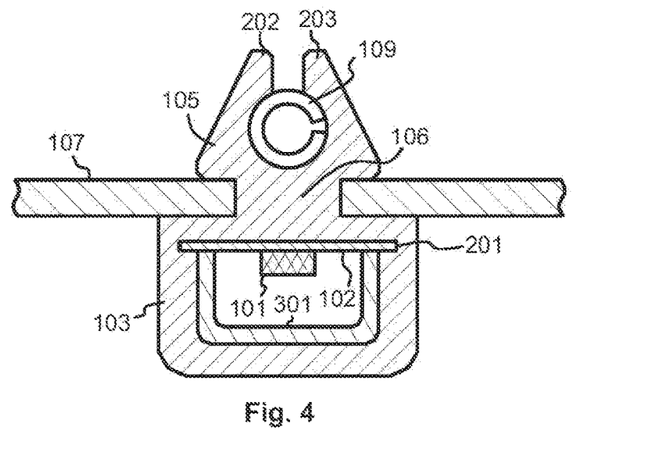
FIG. 4 illustrates a cross-section of the structure according to FIG. 3 in assembled form.

FIGS. 3 and 4 illustrate a LED strip which is otherwise similar to FIGS. 1 and 2 but further comprises a light-transmitting optical element 301 inside the tube 103 on that side of the strip 102 to which the LEDs 101 are fixed. The optical element 301 is in the same way elongated as the tube 103 and the fixing element 104. It may thus continue in the longitudinal direction of the tube 103 over several LED chips 101. The optical element 301 may even be exactly as long as the tube 103, in which case the cross-section illustrated in FIG. 4 may be maintained substantially the same from one end of the tube 103 to the other.

In the embodiment illustrated in FIGS. 3 and 4 the optical element 301 is in cross-section a U-shaped trough. The sizing of the optical element 301, the strip 102 and the tube 103 may be selected in such a way that in the finished assembly the force resulting from the elasticity of the material of the tube 103 presses the edges of the optical element 301 against the strip 102. Specifically, in such embodiment the slots at the inner surface of the tube 103 may be omitted altogether, although they have been drawn in FIGS. 3 and 4. The pressing force of the tube ensures that the optical element 301 and the strip 102 with the LED chips 101 are kept in their proper places.

By the use of the optical element 301 it is possible to influence for example how the light emitted by the LED chips looks outside the LED strip. The optical element 301 may comprise for example colour or other filters and/or fluorescent materials which affect the colour and/or colour temperature of the light visible to the outside. The optical element 301 may also comprise diffuser structures such as microprisms or light-refracting or -reflecting structures such as lenses or mirror surfaces. The purpose of the diffuser structures may be for example that the light produced by the LED chips would not be seen outside the LED strip as a plurality of bright light spots, but that the entire LED strip would seem to emit light evenly at all points. By the lenses and mirror surfaces it is possible to more selectively influence in which direction light is particularly directed.

In the examples illustrated in FIGS. 1 and 3 the slot 108 of the body 107 is straight. However, this is not essential, but the slot 108 may also meander in many different directions. The elasticity of the material from which the tube 103 and the fixing element 104 are manufactured ensures that if desired, the LED strip may be bent into many different meanders. If this feature is to be maintained also in the embodiments in which the light-transmitting optical element 301 is used inside the tube, it must also be manufactured from an elastic material and/or formed in such a way that it does not unnecessarily limit the bendability of the LED strip.

The figures illustrate one possible shape of the cross-section of the tube 103, i.e. a rectangle with partially rounded corners, which is the same in many of the embodiments discussed herein. The tube may be in cross-section of almost any shape, such as a circle, semi-circle, square, some polygon, or a combination thereof. Further, it is not essential in the invention that all walls of the tube should be roughly the same thickness as in the embodiments discussed above, but in the cross-section of the tube there may be areas of quite different thicknesses.

The outer surface of the tube and/or the material of the tube may comprise different shapes, patterns and/or added materials for example to achieve a desired decorative effect or mechanical property of the tube. One example of the added material is different types of crystals or metal flakes by which it is possible to make the light sparkle in different directions for a decorative effect.

Figure 5:
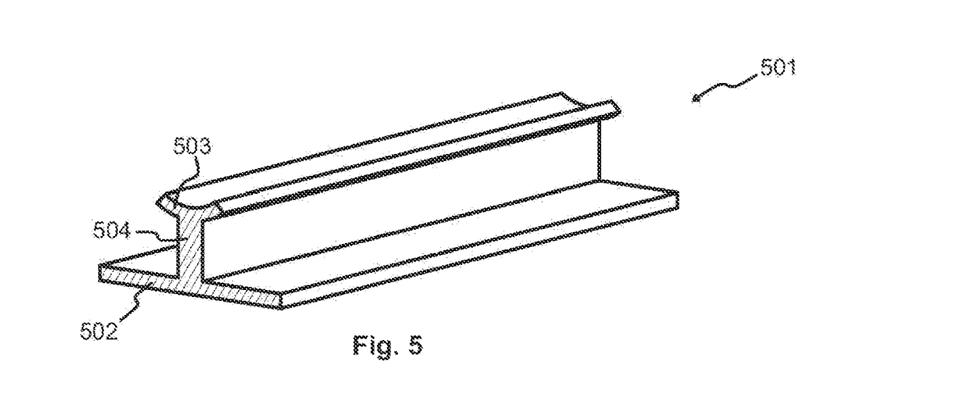
FIG. 5 illustrates a thermally conductive part which may be used in a LED strip.

FIG. 5 illustrates a thermal conduction part which may form part of the LED strip. The purpose of the thermal conduction part is to conduct waste heat generated in the LED chips out from the tube. For this purpose it is advantageous that, in the cross-section of the LED strip, the thermal conduction part is directed outwards from the inner surface of the tube. Because waste heat is generated in all the LED chips participating in the production of light, the thermal conduction part preferably continues in a longitudinal direction of the tube substantially as far as there are LED chips in the strip surrounded by the tube. Alternatively there may be several thermal conduction parts, such that a line formed by them continues in a longitudinal direction of the tube substantially as far as there are LED chips in the strip surrounded by the tube.

The material of the thermal conduction part or parts preferably conducts heat as well as possible. Many metals or metal alloys with good thermal conductivity may be applicable, such as copper, aluminium or some brass alloy with good thermal conductivity. Because the choice of material of the tube is governed by completely different factors, in the solutions discussed herein the thermal conduction part is of a material different from the tube.

Figure 6:
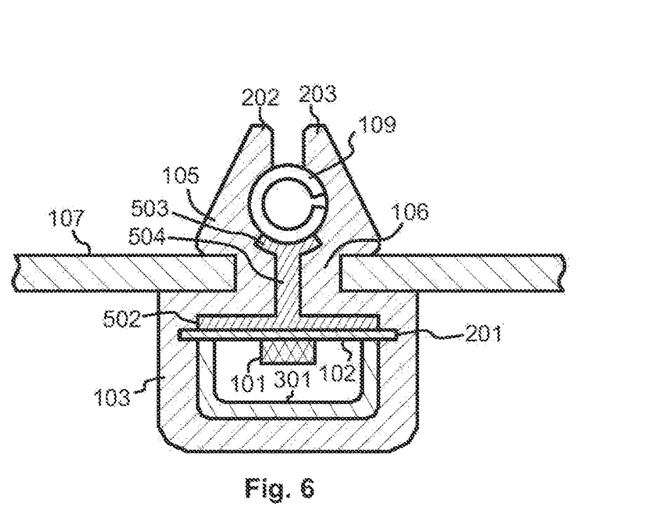
FIG. 6 illustrates a cross-section of a LED strip in which the thermally conductive part according to FIG. 5 is used.

FIG. 6 shows in the form of cross-section how the thermal conduction part according to FIG. 5 could form part of a LED strip which in other features corresponds to that illustrated in FIGS. 3 and 4. In the embodiment of FIG. 6 the profile formed by the tube 103, the locking part 105 and the neck part 106 is not solid but has a split in the middle of the neck part 106. The thermal conduction part 501 comprises an inner flange 502 which is on the inner surface of the tube 103 against the strip 102, specifically against its back surface, i.e. the surface not comprising the LED chips. The thermal conduction part 501 also comprises an outer flange 503 which is on the surface of a cavity in the fixing element 104. In this embodiment the cavity corresponds to the socket formed between the branches 202 and 203 of the locking part 105 for receiving the securing element 109. In addition, the thermal conduction part 501 comprises a portion 504 connecting the inner flange 502 with the outer flange 503. In this embodiment, the heat is first transferred by conduction from the LED chips 101 through the strip 102 to the inner flange 502 and from there along the connecting portion 504 to the outer flange 503. At parts where the outer flange contacts the roll pin 109 or other securing element, the conduction of heat continues to the securing element. In other parts the heat is transferred forward from the outer flange 503 by the effect of convection.

Figure 7:
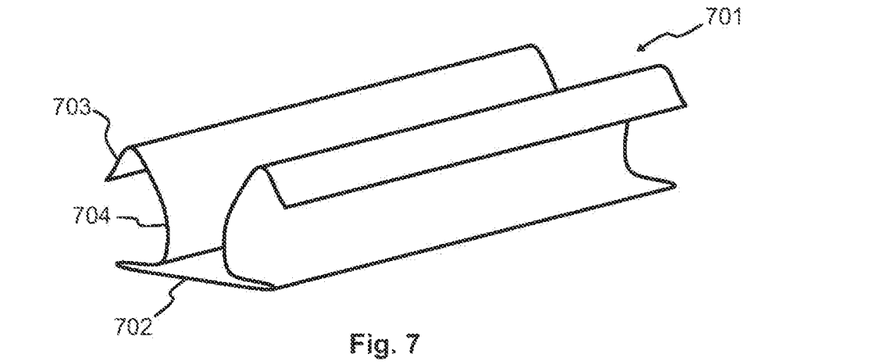
FIG. 7 illustrates a thermally conductive part which may be used in a LED strip.

FIG. 7 illustrates another thermal conduction part 701. It differs from the embodiment of FIG. 5 in terms of cross-section, as the thermal conduction part 701 of FIG. 7 comprises two outer flanges located symmetrically on both edges of the thermal conduction part 701. As an example, outer flange 703 is illustrated in FIG. 7. Correspondingly there are also two portions 704 connecting the inner flange 702 with the outer flanges 703. The thermal conduction part according to FIG. 7 may be manufactured for example by bending from sheet metal.

Figure 8:
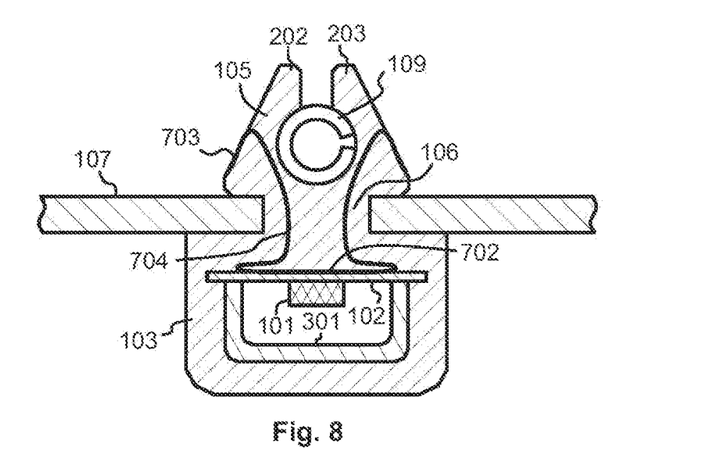
FIG. 8 illustrates a cross-section of a LED strip in which the thermally conductive part according to FIG. 5 is used.

The cross-section of FIG. 8 shows how the thermal conduction part according to FIG. 7 may be located in the LED strip. The inner flange 702 is also in this case on the inner surface of the tube 103 against the strip 102. The outer flanges 703 are on the outer surfaces of the respective branches of the fixing element (specifically of the locking part 105 thereof). The portions 704 connecting the inner flange 702 with the outer flanges 703 extend through the neck part 106 of the fixing element.

The thermal conduction part 701 illustrated in FIGS. 7 and 8 may be arranged in place in the LED strip in the same manufacturing stage in which the tube 103 and the fixing element 104 are manufactured. If the unit formed by the latter is manufactured by extruding or by other method generally used for the manufacture of profiles, the thermal conduction part 701 may function as a so-called insert, i.e. it may be placed inside the material mass which is still in a fluid or gel form before it solidifies. The same type of insert method is applicable if the unit formed by the tube 103 and the fixing element 104 is manufactured in a mould by injection-moulding or casting.

Figure 9:
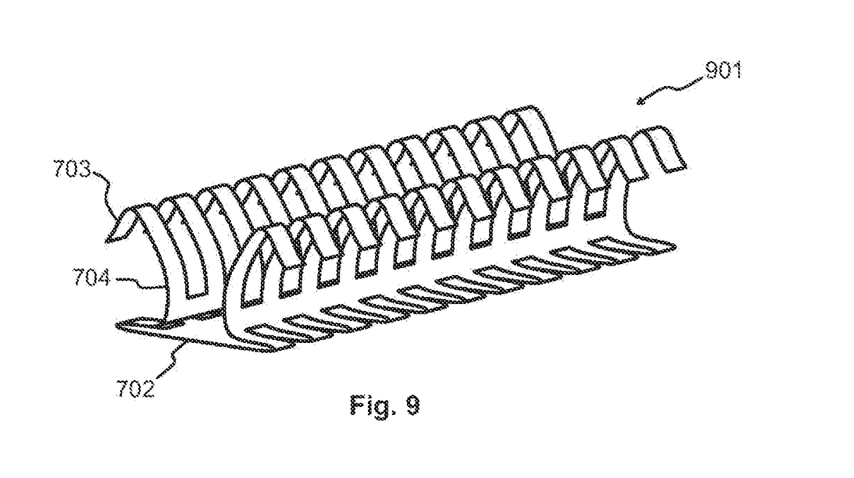
FIG. 9 illustrates a thermally conductive part which may be used in a LED strip.

FIG. 9 illustrates a third thermal conduction part 901. It differs from the embodiment of FIG. 5 in that the thermal conduction part 901 is gapped in the longitudinal direction of the tube with repeated gaps to improve flexibility of the thermal conduction part 901. The figure illustrates one exemplary way for providing the gapping and a person skilled in the art is able to design on this basis a gapping which is best suited for a particular application. In the design of the gapping, not only the effect of the gapping on the flexibility of the thermal conduction part but also its effect on the processibility of the thermal conduction part in the manufacturing method are to be considered. One possible gapping is such where the thermal conduction part forms a spring after the gapping, i.e. it consists of periodically repeated successive portions, each of which forms a ring with ends at different points in the longitudinal direction of the thermal conduction part. It is known to be characteristic of the spring-type shape that it may be easily bent in all transverse directions.

Figure 10:
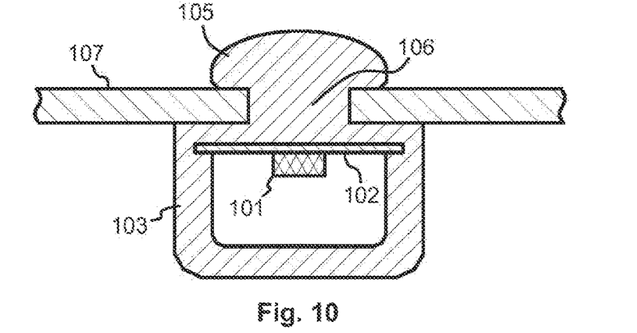
FIG. 10 illustrates a cross-section of a LED strip.

FIG. 10 illustrates a cross-section of a LED strip. This embodiment reminds that the fixing element does not need to be branched in all embodiments. If the manufacturing material is sufficiently elastic, it is also possible to push a locking part 105 of the fixing element which is solid in the transverse direction as in FIG. 10 through a slot or a hole of the body 107 such that the LED strip becomes fixed to the body 107. This embodiment reminds also that the narrower dimension of the neck part in the fixing element may be a result of assembling the luminaire: in a stand-alone state, the fixing element may have a cross section where no narrower neck part is discernible, but pushing or pulling the fixing element through a slot or hole in the luminaire body may leave one portion of the fixing element permanently under an elastic deformation that results from it becoming squeezed it in the slot or hole.

Figure 11:
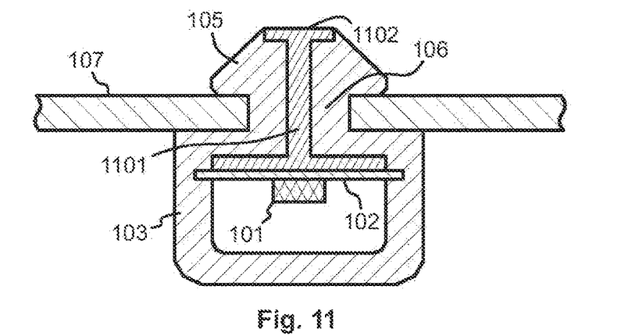
FIG. 11 illustrates a cross-section of a LED strip.

FIG. 11 illustrates a cross-section of a LED strip. This embodiment reminds that the outer flange 1102 of the thermal conduction part 1101 may be arranged on the outer surface of the fixing element. In this embodiment it extends up to the upper edge of the branched locking part 105 and at the same time functions as a type of securing element.

Figure 12:
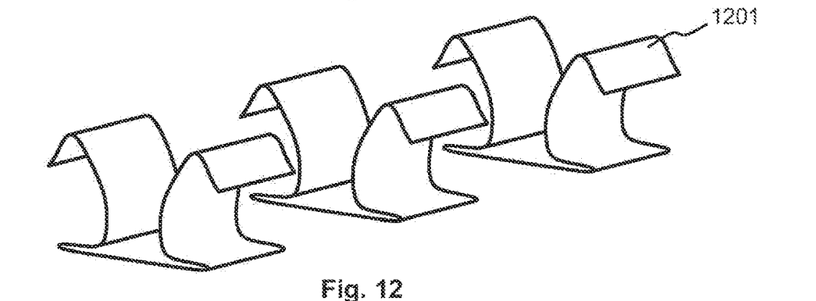
FIG. 12 illustrates a line of thermally conductive parts which may be used in a LED strip.

FIG. 12 illustrates several thermal conduction parts 1201, whereby in the finished LED strip a line formed by them may continue in a longitudinal direction of the tube substantially as far as there are LED chips in the strip surrounded by the tube. In cross-section the thermal conduction parts 1201 of FIG. 12 correspond to the thermal conduction parts of FIGS. 7 and 9, but by applying the same principle it is also possible to utilize thermal conduction parts of a different cross-section. The processing of separate thermal conduction parts may be more difficult in the manufacturing stage than that of a continuously extending thermal conduction part, but correspondingly in the finished LED strip they may allow even greater bendability than a continuously extending thermal conduction part, even if it would be gapped.

Figure 13:
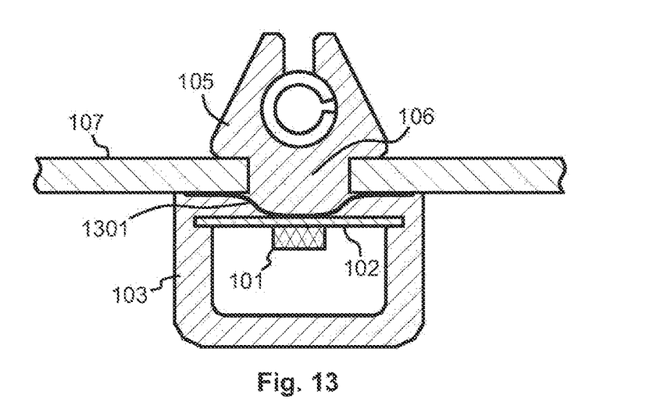
FIG. 13 illustrates a cross-section of a LED strip.

FIG. 13 illustrates a cross-section of a LED strip. This embodiment reminds that the outer flange of the thermal conduction part 1301 may also be arranged on the outer surface of the tube 103 for example in that part of the tube 103 which is set against the body 107 in the finished assembly. This principle may be combined with any possible design and sizing principle of the thermal conduction part as described above. The thermal conduction part 1301 may thus be for example continuous in the longitudinal direction of the tube 103 or there may be several of them in a line, and the thermal conduction part 1301 may be gapped to improve its bendability. It is also possible to make a LED strip in which some of the thermal conduction parts are in cross-section as in FIG. 12 and some others of the thermal conduction parts, for example every second thermal conduction part, are in cross-section as in FIG. 13.

Figure 14:
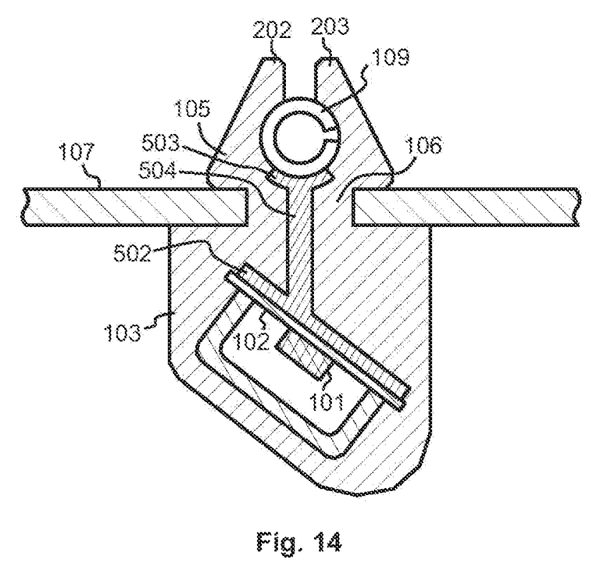
FIG. 14 illustrates a cross-section of a LED strip.

FIG. 14 illustrates a cross-section of a LED strip. This embodiment reminds that the strip 102 to which the LED chips 101 are fixed may be positioned at various inclinations in the cross-section of the LED strip. The possible angle of inclination of the strip 102 does not need to be the same throughout the whole length of the LED strip, but it may be different at different points. Likewise, the cross-section of the tube 103 may vary along the length of the LED strip, possibly following variations in the angle of inclination of the strip 102. In the embodiment of FIG. 14 the basic configuration of the thermal conduction part is similar to FIG. 5 above, however in such a way that the position of the strip 102 inside the tube 103 has been taken into consideration in the design and sizing of its inner flange 502 and portion 504 connecting the inner flange 504 with the outer flange 503.

Figure 15:
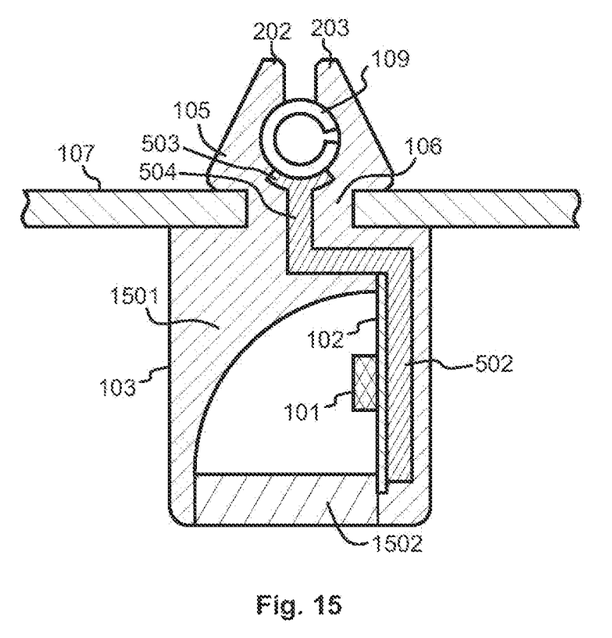
FIG. 15 illustrates a cross-section of a LED strip.

FIG. 15 illustrates a cross-section of a LED strip. This embodiment reminds that by the design of the tube 103 and the choice of materials it is possible to influence in many ways how the light produced by the LED chips 101 is directed outside the tube 103. In the embodiment of FIG. 15 the tube 103 is manufactured from two materials, of which the material of an upper portion 1501 is light-reflecting and the material of a lower portion 1502 is light-transmitting. The strip 102 is placed in the tube 103 such that at least the main part of the light emitted by the LED chips 101 first falls on the concave inner wall of the portion 1501 manufactured from the reflective material. The light reflected therefrom is emitted out through the portion 1502 manufactured from the light-transmitting material. In this type of solution at least the main part of the light thus passes via two optical elements, which is likely to smooth the distribution of the light observable from the outside. A situation where, as seen from the outside, the LED strip appears to emit light evenly throughout its length and it is impossible to distinguish the individual LEDs may be easily achieved with this type of solution.

Figure 16:
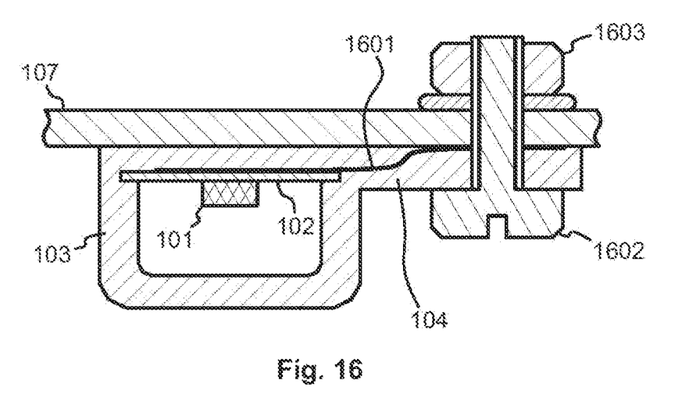
FIG. 16 illustrates a cross-section of a LED strip.

FIG. 16 illustrates a cross-section of a LED strip. This embodiment reminds that a LED strip in which the fixing element 104 projects from the outer surface of the tube 103 may also be fixed with screws, rivets or corresponding fixing means, of which a bolt 1602 and a nut 1603 are illustrated as examples in FIG. 16. In this embodiment, the fixing element 104 and the body 107 to which the LED strip is fixed comprise holes arranged in alignment with each other, corresponding to the fixing means. In the embodiment of FIG. 16 the cross-section of the thermal conduction part 1601 is directed outwards from the inner surface of the tube 103, continuing to that surface of the fixing element 104 which in the fixing is set against the body 107. The inner flange of the thermal conduction part 1601 is on the inner surface of the tube 103 against the back surface of the strip 102 and the outer flange is on the outer surface of the fixing element 104. The fixing means (the bolt 1602 and the nut 1603) may provide a pressing force which improves the conduction of heat between the outer flange of the thermal conduction part 1601 and the body 107. All which is stated above concerning the possible gapping or the spring-type shape of the thermal conduction part, the use of successive thermal conduction parts etc. is also applicable as such to this embodiment.

Figure 17:
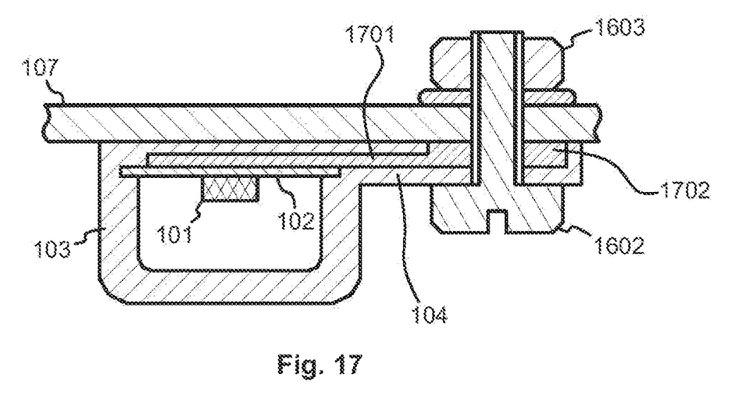
FIG. 17 illustrates a cross-section of a LED strip.

FIG. 17 illustrates a cross-section of a LED strip. This embodiment reminds that the thermal conduction part does not necessarily have to be manufactured from sheet metal or other thin, strip-type material. The embodiment of FIG. 17 corresponds in other parts to the embodiment of FIG. 16, but the cross-section of the thermal conduction part 1701 comprises one or more thicker portions 1702 at points where the thermal conduction part is perforated for the fixing means and forms the outer flange set against the body 107. The thermal conduction part having a variable cross-section according to the principle of FIG. 17 may be manufactured for example from a metal profile or a material alloyed with a strongly thermally conductive substance, which is supplied to the same stage of the manufacturing process where also the tube 103 is formed.

The luminaire in which the LED strip is provided as a part may be finished in terms of appearance and/or functionality by using for example specially designed end pieces attached to the ends of the LED strip. The end pieces, if they are used, may also be used as connectors for providing the necessary electrically conductive couplings with conductors laid on the surface of the strip to which the LED chips are fixed. The use of end pieces as part of elongated LED luminaires is prior art known per se and does therefore not need to be described more specifically herein.

Any LED strip as described above may preferably be manufactured using a method comprising, as a preparatory operation, manufacturing a tube from an elastic and at least partly light-transmitting material and, in connection with manufacturing the tube, manufacturing from the same material a fixing element which projects from the outer surface of the tube. The fixing element is provided with a locking part and a neck part, of which the neck part is narrower than the locking part in a transverse direction of the tube and is located between the tube and the locking part. Specifically, this fixing element is manufactured in such a way that it continues in the longitudinal direction of the tube, forming a uniform profile with the tube. A second preparatory operation comprises fixing LED chips to a strip on the surface of which conductors have been formed, and coupling the LED chips with the conductors such that, by electric current conducted in a controlled manner via the conductors, it is possible to cause the LED chips to emit a desired amount of a desired type of light. In an assembly stage, the strip with the LED chips is placed inside the tube.

The assembly stage may be carried out for example in such a way that the tube is temporarily expanded by blowing compressed air therein when placing the LED strip with the LED chips inside the tube. In this respect, the elasticity of the material of which the tube is manufactured provides an advantage. The expansion of the tube by the effect of compressed air blown therein is an elastic deformation that allows conveying the strip to its place in the longitudinal direction inside the tube without adhering too soon to the inner surface of the tube. Conveying the strip to its place may be achieved for example by a blowing method known per se.

The manufacturing method may comprise providing the tube with a thermal conduction part directed outwards from the inner surface of the tube for conducting waste heat generated during use in the LED chips out from the tube. One possibility is to use a profiled, thermally conductive strip continuing in a longitudinal direction of the tube substantially as far as there are LED chips in the strip surrounded by the tube as the thermal conduction part. An alternative may be to use several thermal conduction parts arranged in the tube as a line continuing in the longitudinal direction of the tube substantially as far as there are LED chips in the strip surrounded by the tube. Arranging the thermal conduction part in the tube may be achieved either in connection with the manufacture of the tube (for example by using the thermal conduction part as an insert in a manufacturing method based on extrusion, injection moulding or casting) or in the assembly stage, if the thermal conduction part is for example of the type as illustrated in any of FIG. 5, 6, 11, 14 or 15.

If the thermal conduction part is used, its manufacturing may comprise for example bending the thermal conduction part to a cross-sectionally suitable form from sheet metal or a corresponding material blank. The thermal conduction part may also be gapped in the longitudinal direction of the tube with repeated gaps to improve flexibility of the thermal conduction part. If the thermal conduction part is made of sheet metal, the gapping is most preferably carried out by punching when the sheet is still flat.

The assembly stage of the manufacturing method may also comprise that, in addition to the LED chips and the strip supporting them, a light-transmitting optical element continuing in the longitudinal direction of the tube over several LED chips is placed inside the tube.

The embodiments described above can be modified without departing from the scope of protection of the claims set out hereinafter. For example the thermal conduction part or parts that are described above for simplicity as rather rectilinear and smooth-surfaced may at least in some of their surfaces be grooved, embossed, perforated and/or otherwise formed so that the surface area transmitting heat out from the structure is as large as possible. In particular, it is to note that the features described separately of each other can be combined in many ways.

The invention claimed is:

1. A LED strip, comprising:
   LED chips and a strip to which the LED chips are fixed and which also functions as a support structure of conductors coupled with the LED chips,
   a longitudinally elongate tube manufactured from an elastic and at least partly light-transmitting material and surrounding the strip with the LED chips, and
   at an outer surface of the tube, a fixing element which is in essential parts of the same material as the tube;
   wherein:
   the LED strip comprises a thermal conduction part which is of a material different from the tube and which, in the cross-section of the LED strip, is directed outwards from an inner surface of the tube for conducting waste heat generated in the LED chips out from the tube,
   said fixing element comprises a locking part and a neck part, of which the neck part is narrower than the locking part in a transverse direction of the tube and is located between the tube and the locking part,
   the fixing element continues in the longitudinal direction of the tube such that the tube and the fixing element form a uniform profile,
   the cross-section of the locking part of the fixing element branches into at least two branches such that it allows placement of a separate securing element between these branches, and
   the cross-section of the locking part comprises a widened socket between said branches for receiving a securing element.

2. The LED strip according to claim 1, wherein the thermal conduction part continues in a longitudinal direction of the tube substantially as far as there are LED chips in the strip surrounded by the tube.

3. The LED strip according to claim 1, comprising several thermal con-duction parts in a line that continues in a longitudinal direction of the tube substantially as far as there are LED chips in the strip surrounded by the tube.

4. The LED strip according to claim 1, wherein the thermal conduction part comprises:
   an inner flange which is on the inner surface of the tube against said strip, one or more outer flanges which is or which are on the outer surface of the tube or the fixing element or on the surface of a cavity in the fixing element, and a portion connecting the inner flange with the outer flange or flanges.

5. The LED strip according to claim 1, wherein the thermal conduction part is gapped in the longitudinal direction of the tube with repeated gaps to improve flexibility of the thermal conduction part.

6. The LED strip according to claim 1, comprising a light-transmitting optical element inside the tube on that side of the strip to which the LED chips are fixed, said light-transmitting optical element continuing in the longitudinal direction of the tube over several LED chips.

7. The LED strip according to claim 1, wherein the inner surface of the tube comprises at least one slot for receiving an edge or edges of the strip.

8. A luminaire comprising a body and a LED strip fixed to the body, wherein:
the LED strip comprises LED chips and a strip to which the LED chips are fixed and which also functions as a support structure of conductors coupled with the LED chips,
the LED strip comprises a tube manufactured from an elastic and at least partly light-transmitting material and surrounding the strip with the LED chips,
a longitudinally elongate elastic tube sized to receive the LED strip having at least a section thereof made of a light-transmitting material, the tube has a fixing element projecting from the outer surface of the tube which is made of the same material as the tube,
the LED strip comprises a thermal conduction part which is of a material different from the tube and which, in the cross-section of the LED strip, is directed outwards from the inner surface of the tube for conducting waste heat generated in the LED chips out from the tube,
said fixing element comprises a locking part and a neck part, of which the neck part is narrower than the locking part in a transverse direction of the tube and is located between the tube and the locking part,
the fixing element continues in the longitudinal direction of the tube such that the tube and the fixing element form a uniform profile,
the cross-section of the locking part of the fixing element branches into at least two branches such that it allows placement of a separate securing element between these branches, and
the cross-section of the locking part comprises a widened socket between said branches for receiving a securing element.

9. The luminaire according to claim 8, wherein:
the body comprises an elongated slot,
and
the locking part of the fixing element projects via the slot to a different side of the body than the tube.

10. A method for manufacturing a LED strip, the method comprising:
manufacturing a longitudinally elongate tube from an elastic and at least partly light-transmitting material,
manufacturing, in connection with manufacturing the tube, from the same material a fixing element which projects from the outer surface of the tube and which is provided with a locking part and a neck part, of which the neck part is narrower than the locking part in a transverse direction of the tube and is located between the tube and the locking part, such that the resulting fixing element continues in the longitudinal direction of the tube, forming a uniform profile with the tube, and the cross-section of the locking part of the fixing element branches into at least two branches such that it allows placement of a separate securing element between these branches, and the cross-section of the locking part comprises a widened socket between said branches for receiving the securing element,
fixing LED chips to a strip on the surface of which conductors have been formed, and coupling said LED chips with said conductors, and
placing the strip with the LED chips inside the tube,
wherein the tube is provided with a thermal conduction part directed out-wards from the inner surface of the tube for conducting waste heat generated in the LED chips out from the tube.

11. The method according to claim 10, wherein a profiled thermally conductive strip continuing in a longitudinal direction of the tube substantially as far as there are LED chips in the strip surrounded by the tube is used as the thermal conduction part.

12. The method according to claim 10, in which method the thermal conduction part is gapped in the longitudinal direction of the tube with repeated gaps to improve flexibility of the thermal conduction part.

13. The method according to claim 10 wherein, in addition to the LED chips and the strip supporting them, a light-transmitting optical element continuing in the longitudinal direction of the tube over several LED chips is placed inside the tube.

14. A method for manufacturing a LED strip, the method comprising:
manufacturing a longitudinally elongate tube from an elastic and at least partly light-transmitting material,
fixing LED chips to a strip on the surface of which conductors have been formed, and coupling said LED chips with said conductors,
placing the strip with the LED chips inside the tube,
manufacturing, in connection with manufacturing the tube, from the same material a fixing element which projects from the outer surface of the tube and which is provided with a locking part and a neck part, of which the neck part is narrower than the locking part in a transverse direction of the tube and is located between the tube and the locking part, and
preforming said manufacture of the fixing element in such a way that the resulting fixing element continues in the longitudinal direction of the tube, forming a uniform profile with the tube,
wherein the tube is provided with a thermal conduction part directed out-wards from the inner surface of the tube for conducting waste heat generated in the LED chips out from the tube.

* * * * *